(12) United States Patent
Yang

(10) Patent No.: US 12,363,888 B2
(45) Date of Patent: Jul. 15, 2025

(54) MEMORY CIRCUITRY AND METHOD USED IN FORMING MEMORY CIRCUITRY

(71) Applicant: Micron Technology, Inc., Boise, ID (US)

(72) Inventor: Guangjun Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 18/243,298

(22) Filed: Sep. 7, 2023

(65) Prior Publication Data

US 2023/0422483 A1    Dec. 28, 2023

Related U.S. Application Data

(62) Division of application No. 17/364,154, filed on Jun. 30, 2021, now Pat. No. 11,785,762.

(51) Int. Cl.
  *H10B 12/00*  (2023.01)
(52) U.S. Cl.
  CPC ......... *H10B 12/34* (2023.02); *H10B 12/0335* (2023.02); *H10B 12/053* (2023.02); *H10B 12/315* (2023.02); *H10B 12/482* (2023.02)
(58) Field of Classification Search
  None
  See application file for complete search history.

(56) References Cited

U.S. PATENT DOCUMENTS

| | | | |
|---|---|---|---|
| 5,990,021 A | 11/1999 | Prall et al. | |
| 8,234,782 B2 | 8/2012 | Tang | |
| 8,361,856 B2 * | 1/2013 | Heineck | H10B 12/48 438/242 |
| 10,229,874 B1 | 3/2019 | Ramaswamy | |
| 10,475,796 B1 * | 11/2019 | Wang | H10B 12/482 |
| 10,770,465 B1 | 9/2020 | Kim et al. | |
| 11,342,336 B1 | 5/2022 | Benson | |

(Continued)

*Primary Examiner* — Steven M Page
(74) *Attorney, Agent, or Firm* — Wells St. John P.S.

(57) ABSTRACT

A method used in forming memory circuitry comprises forming transistors individually comprising one source/drain region and another source/drain region. A channel region is between the one and the another source/drain regions. A conductive gate is operatively proximate the channel region. Conductive vias are formed that are individually directly electrically coupled to the another source/drain region. Conductor material is formed that is directly coupled to the one source/drain region. The conductor material is patterned in one direction to form horizontal lines of the conductor material that have a horizontal trench between immediately-adjacent of the horizontal conductor-material lines. In a self-aligned manner, digitlines are formed that are individually in individual of the trenches between the immediately-adjacent conductor-material lines. After forming the digitlines, the conductor material is patterned in another direction that is horizontally angled from the one direction to form conductor vias that are individually directly electrically coupled to the one source/drain region. A plurality of storage elements is formed that are individually directly electrically coupled to individual of the conductor vias. Other aspects, including structure independent of method, are disclosed.

20 Claims, 17 Drawing Sheets

(56) References Cited

U.S. PATENT DOCUMENTS

| | | | |
|---|---|---|---|
| 2007/0246803 A1* | 10/2007 | Haller | H10B 12/50 257/640 |
| 2020/0066731 A1* | 2/2020 | Iwaki | H10B 12/31 |
| 2020/0295011 A1 | 9/2020 | Sandhu et al. | |
| 2021/0265359 A1 | 8/2021 | Ishigami et al. | |

* cited by examiner

MEMORY CIRCUITRY AND METHOD USED IN FORMING MEMORY CIRCUITRY

RELATED PATENT DATA

This patent resulted from a divisional application of U.S. patent application Ser. No. 17/364,154, filed Jun. 30, 2021, entitled "Memory Circuitry And Method Used In Forming Memory Circuitry", naming Guangjun Yang as inventor, the disclosure of which is incorporated by reference.

TECHNICAL FIELD

Embodiments disclosed herein pertain memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

DETAILED DESCRIPTION OF EXAMPLE EMBODIMENTS

Embodiments of the invention encompass memory circuitry, such as DRAM, and methods used in forming memory circuitry, such as a DRAM. First example embodiments comprising a DRAM construction are described with reference to FIGS. 1-7 showing an example fragment of a substrate construction 8 comprising an array or array area 10 that has been fabricated relative to a base substrate 11. Substrate construction 11 may comprise any one or more of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1-7-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
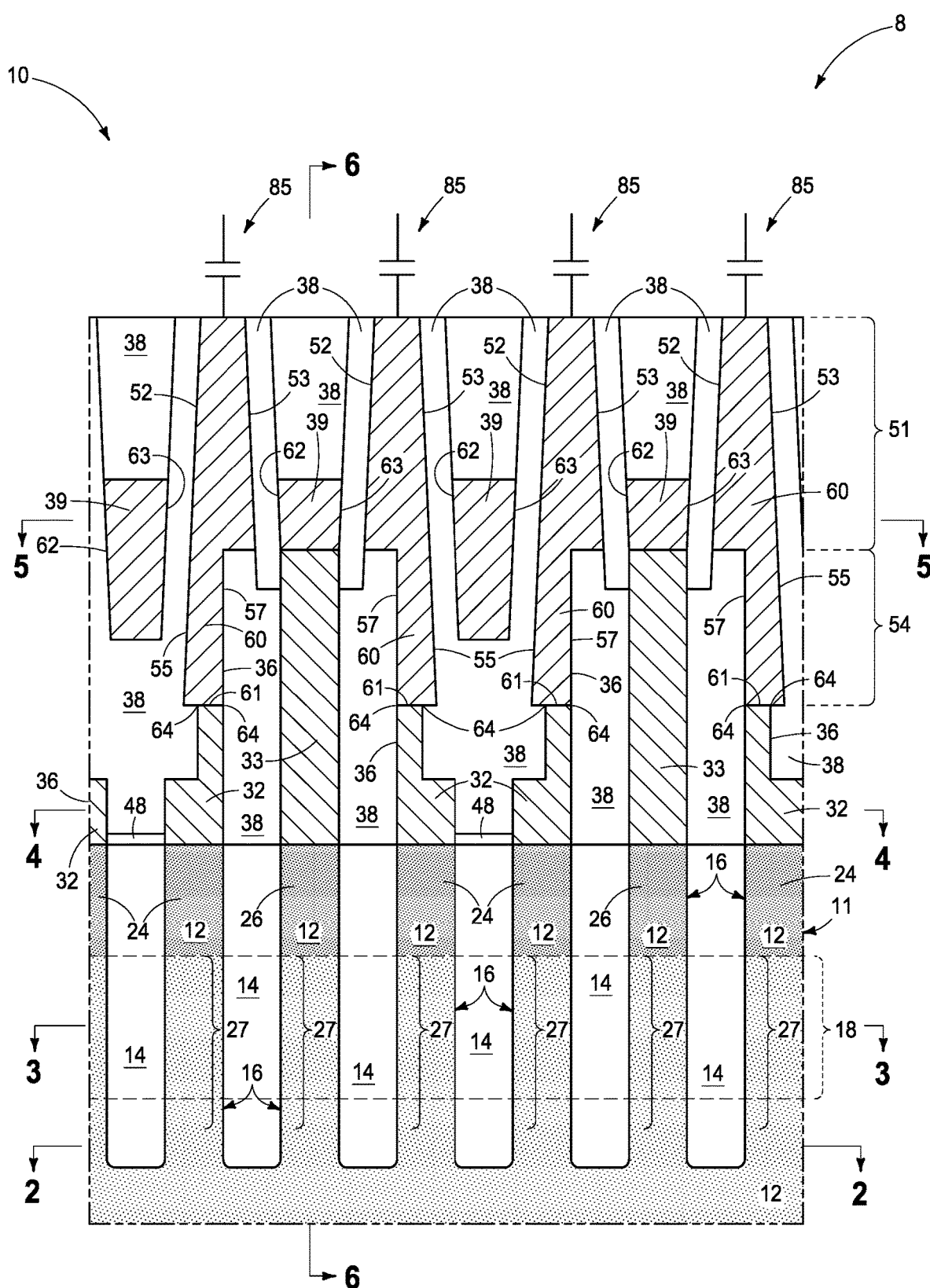
FIGS. 1-7 are diagrammatic cross-sectional views of a portion of a DRAM construction in accordance with some embodiments of the invention.
Figure 2:
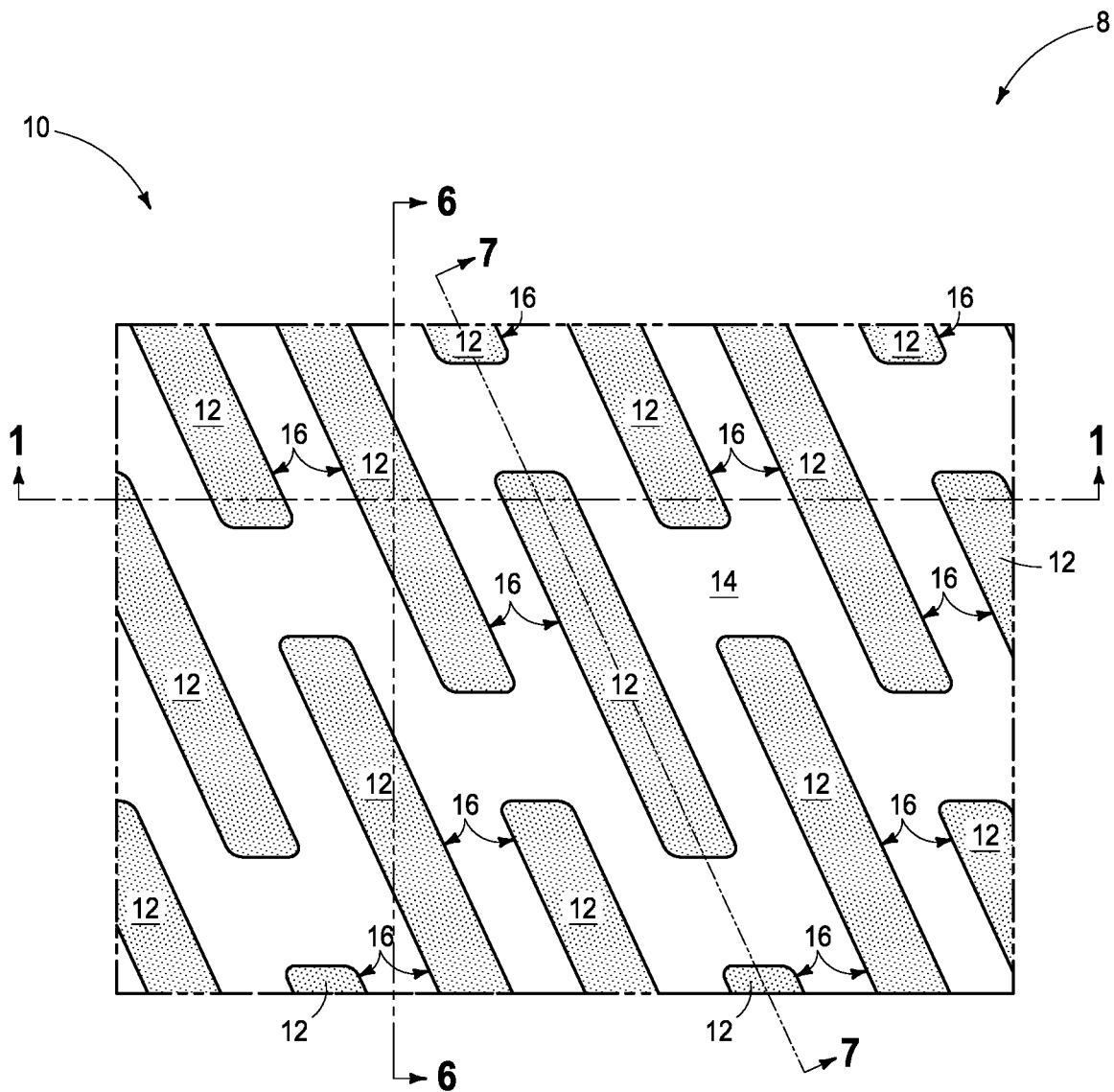
Figure 3:
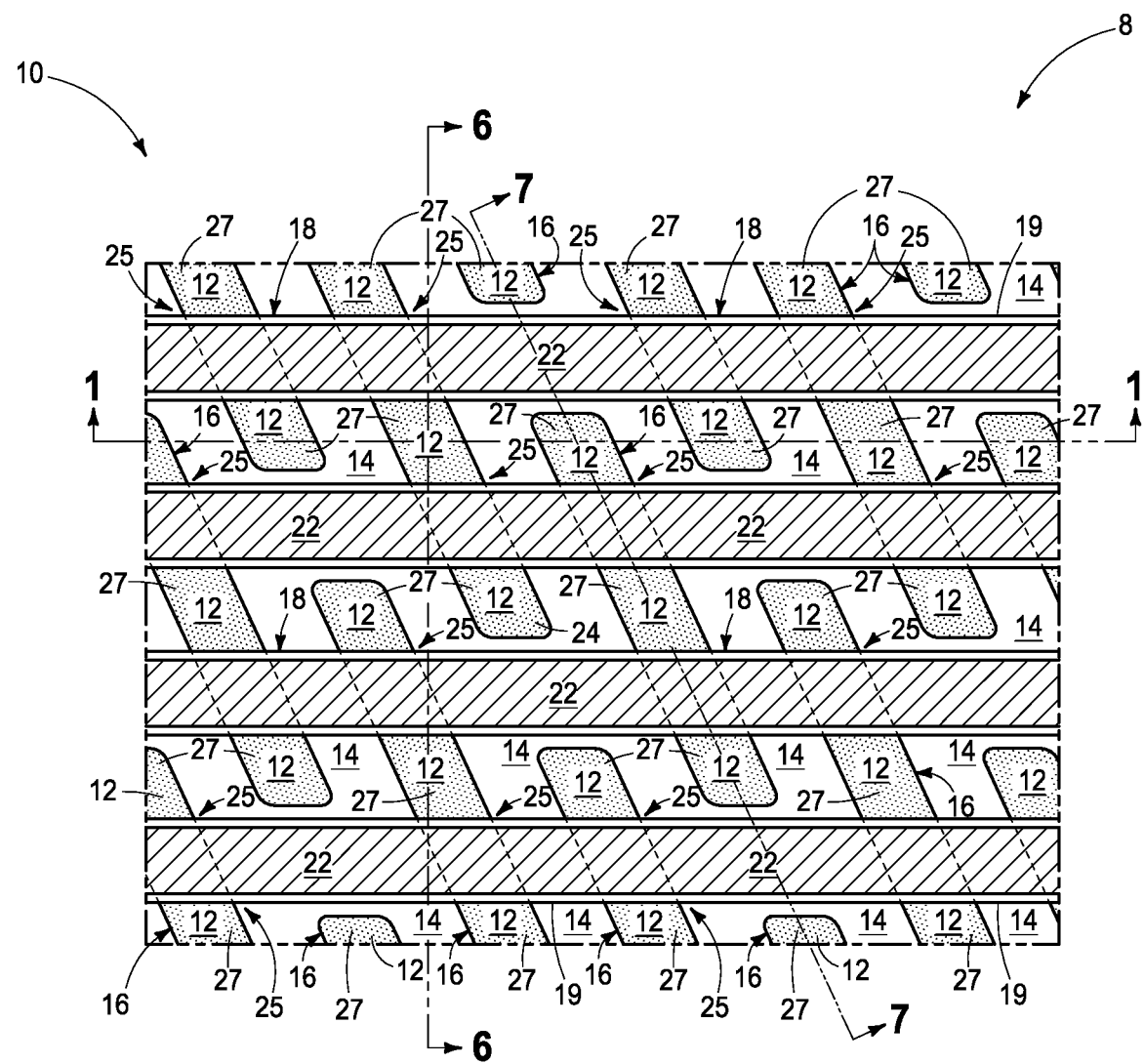
Figure 4:
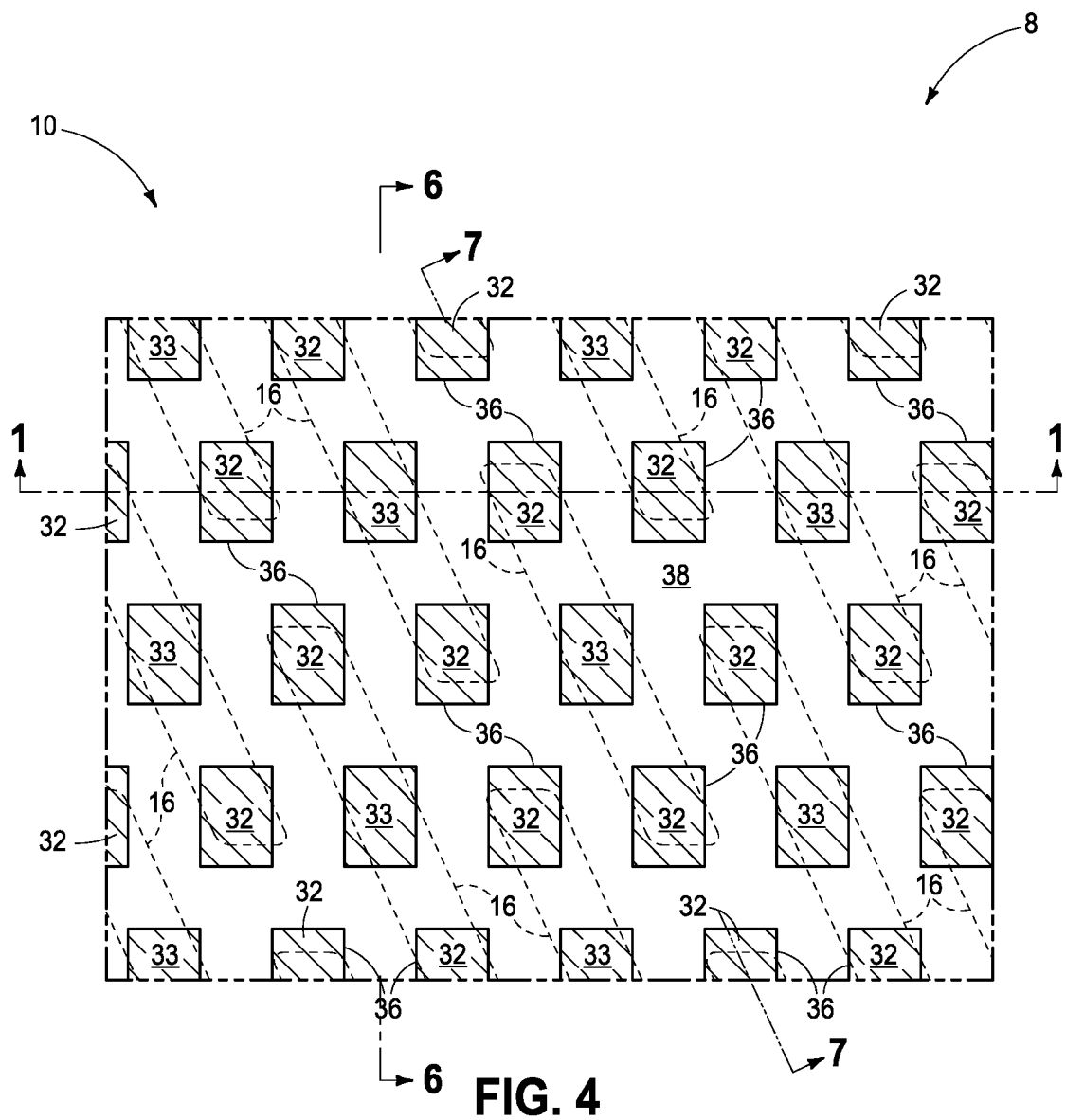
Figure 5:
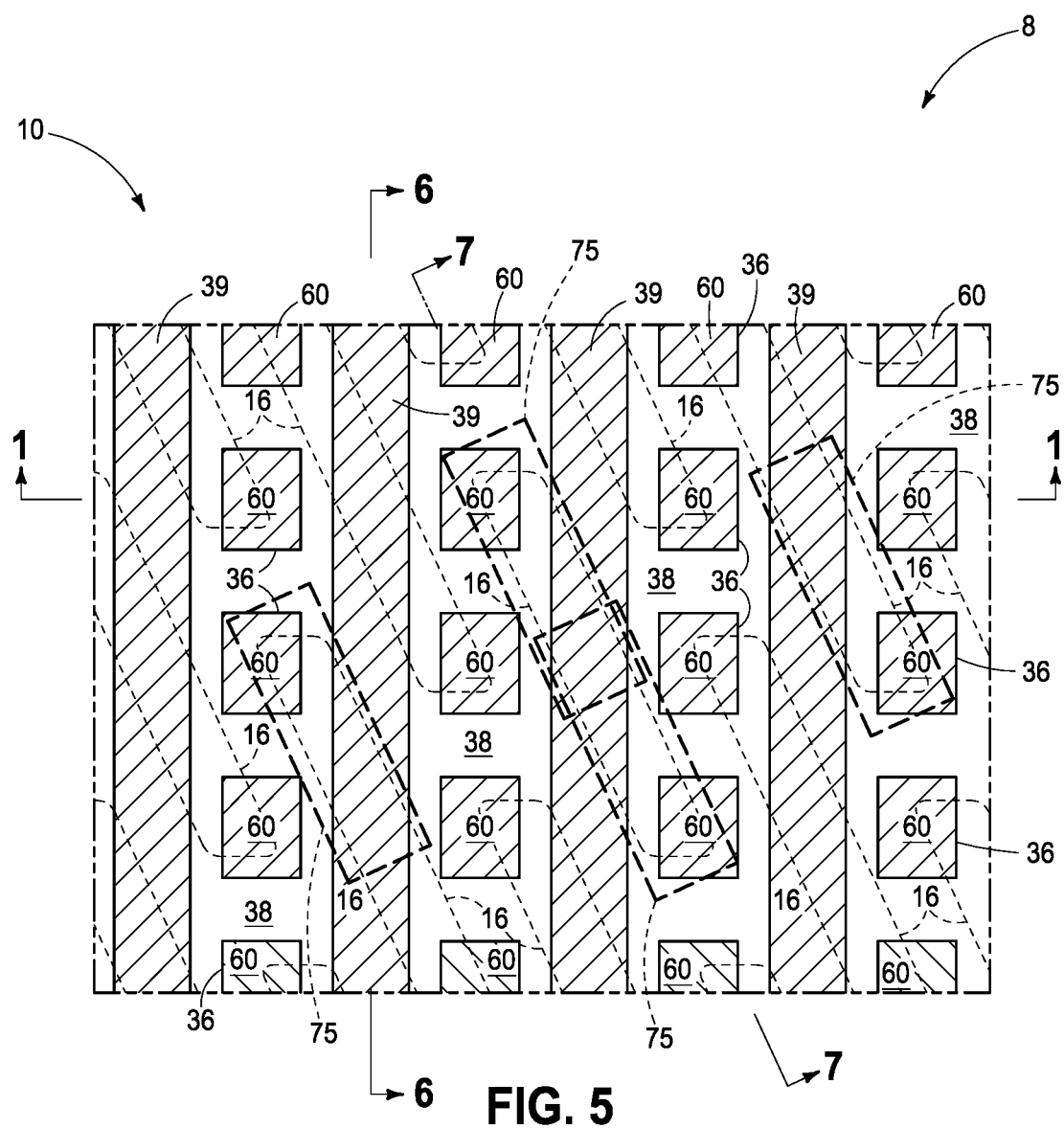
Figure 7:
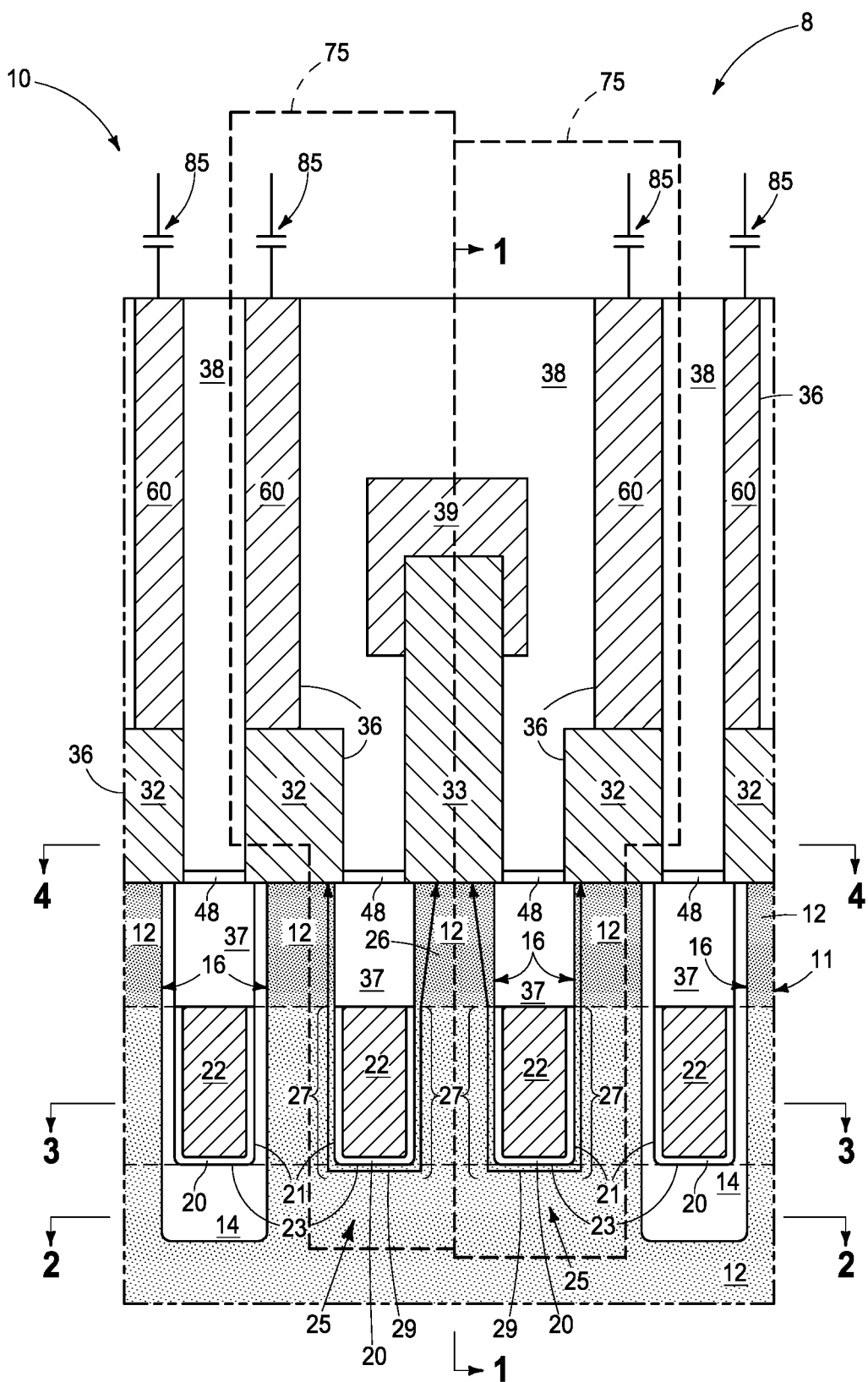

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 comprises memory cells 75 (FIGS. 5 and 7, and with only four outlines 75 shown in FIG. 5 and only two outlines 75 in FIG. 7 for clarity in such figures), for example DRAM memory cells individually comprising a field effect transistor device 25 (FIG. 3) and a storage element (e.g., a capacitor 85; FIGS. 1 and 7). However, embodiments of the invention encompass other memory cells and other constructions of integrated circuitry independent of whether containing memory cells.

Example transistor devices 25 individually comprise a pair of source/drain regions, a channel region between the pair of source/drain regions, a conductive gate operatively proximate the channel region, and a gate insulator between the conductive gate and the channel region. Devices 25 are shown as being recessed access devices, with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material, including for example elemental W, Ru, and/or Mo) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

An example channel region 27 (FIGS. 1, 3, 6, and 7) is in semiconductive material 12 below pair of source/drain regions 24, 26 along trench sidewalls 21 (FIGS. 6 and 7) and around trench base 23. Channel region 27 may be undoped or may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 7]) within channel region 27 proximate gate insulator 20 such that current is capable of flowing between a pair of source/drain regions 24 and 26 under the access line construction 18 within an individual active area region 16. Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used, and constant dopant concentration is not required in any region.

Conductor vias 36 (e.g., comprising conductive/conductor materials 32 and 60) are individually directly electrically coupled to one of the source/drain regions (e.g., 24) of the pair of source/drain regions. One of storage elements 85 is directly electrically coupled to individual conductor vias 36 (e.g., there-atop). In one embodiment, conductor vias 36 in a vertical cross-section (e.g., that of FIG. 1) individually include a vertical portion 51 having two sidewalls 52, 53 that taper laterally-outward from top-to-bottom. In one such embodiment and as shown, vertical portion 51 is less-than-all of the respective conductor via 36 in the vertical cross-section. In one such embodiment, vertical portion 51 may be considered as one vertical portion, with conductor vias 36 in the vertical cross-section individually including another vertical portion 54 that is below one vertical portion 51. Another portion 54 has one sidewall 55 that tapers laterally-outward from top-to-bottom and another sidewall 57 that does not taper laterally-outward from top-to-bottom. In one embodiment, another sidewall 57 is vertical. In one embodiment, conductor vias 36 individually comprise lower conductively-doped semiconductive material 32 (e.g., conductively-doped polysilicon) directly electrically coupled to, in embodiment directly against, one source/drain region 24. Conductor material 60 comprises upper metal material 60 that is directly above and directly electrically coupled to, in one embodiment directly against, lower conductively-doped semiconductive material 32. In one embodiment, upper metal material 60 covers all of a top surface 61 of lower conductively-doped semiconductive material 32. In one embodiment, vertical portion 51 is upper metal material 60. In one embodiment, upper metal material 60 extends laterally outward beyond at least one side 64 of top surface 61 (beyond only one side 64 being shown) of lower conductively-doped semiconductive material 32 in a vertical cross-section (e.g., that of FIG. 1).

Conductive vias 33 are individually directly electrically coupled to the other of the source/drain regions (e.g., 26) of the pair of source/drain regions. Digitlines 39 are individually directly electrically coupled to a plurality of conductive vias 33 along a line of multiple of transistors 25. Conductive vias 33 may be of the same or different composition from that of digitlines 39. In one embodiment, digitlines 39 in a vertical cross-section (e.g., that of FIG. 1) individually have two sidewalls 62, 63 that taper laterally-inward from top-to-bottom.

Figure 6:
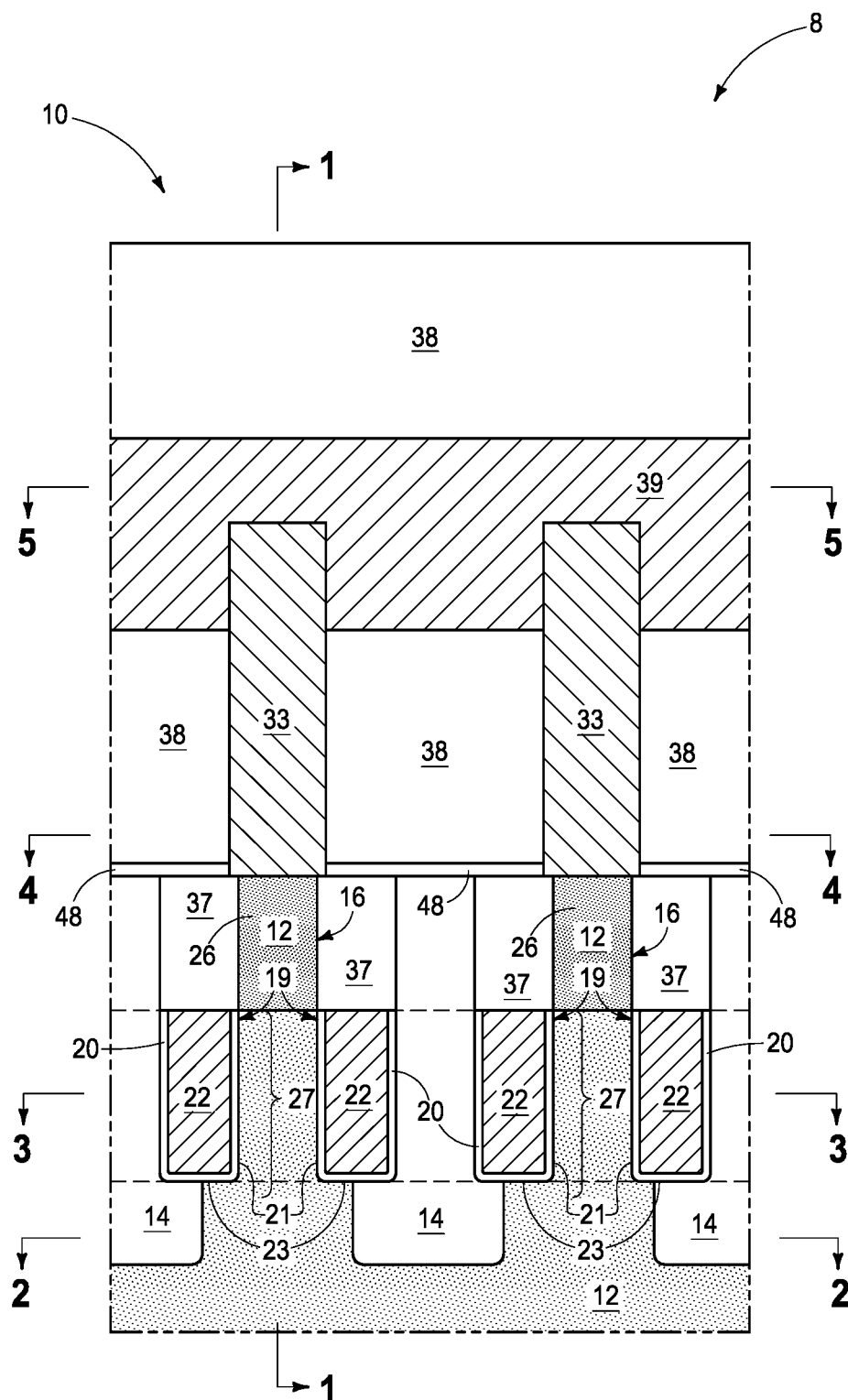

Example insulative material 38 (e.g., silicon nitride and/or silicon dioxide) is about, above, and/or below the example depicted conductive materials. Example material 48 (e.g., silicon nitride and/or silicon dioxide) is below digitlines 39 and insulative material 38 between immediately-longitudinally-adjacent conductive vias 33 (FIGS. 1, 6, 7).

Any other attribute(s) or aspect(s) as shown and/or described herein with respect to other embodiments may be used in the embodiments shown and described with reference to the above embodiments.

Figure 8:
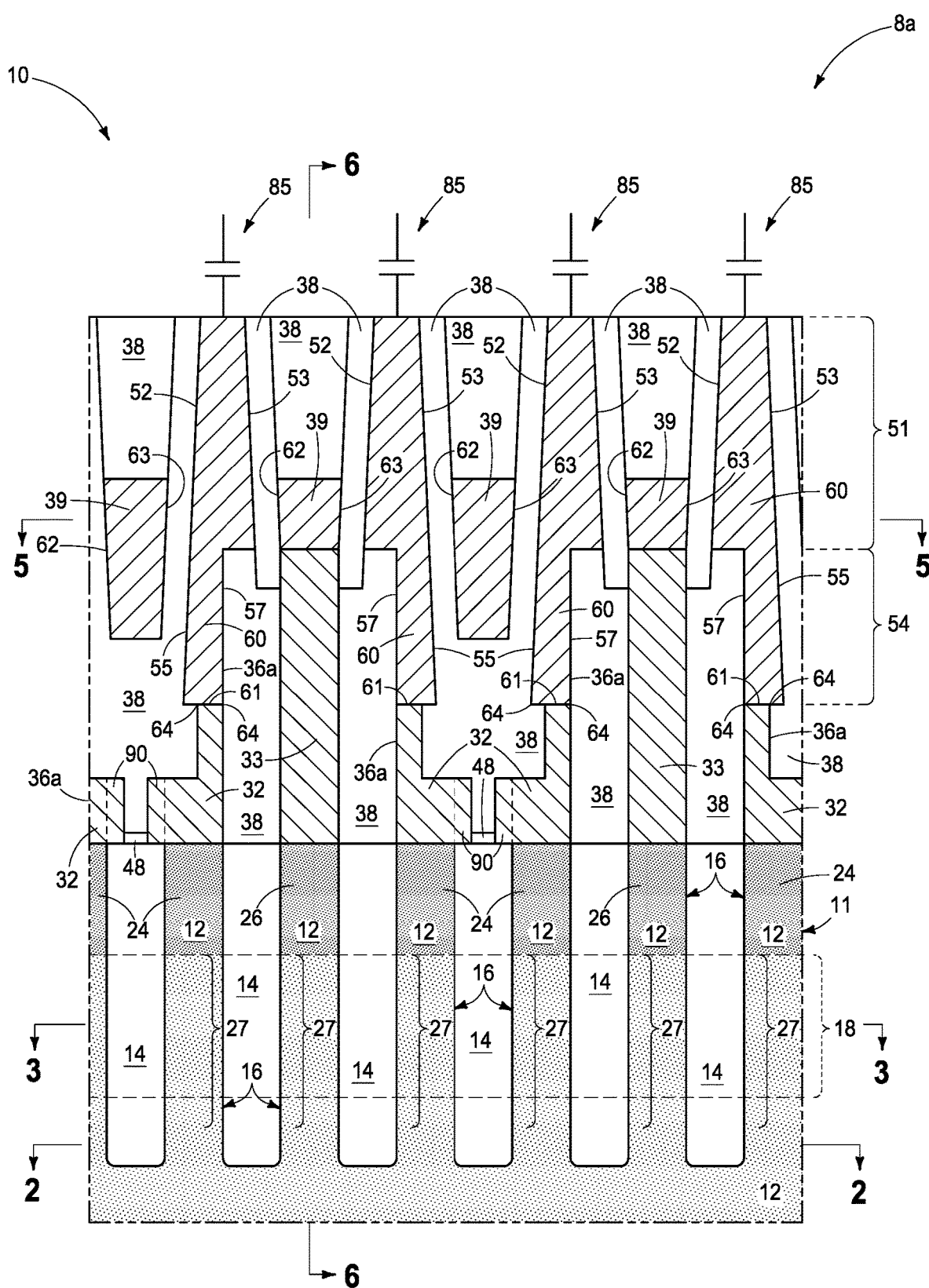
FIG. 8 is a diagrammatic cross-sectional view of a portion of a DRAM construction in accordance with some embodiments of the invention.

FIG. 8 shows an example alternate construction 8a. Like numerals from the above-described embodiments have been used where appropriate, with some construction differences being indicated with the suffix "a" or with different numerals. Conductor vias 36a of construction 8a individually comprise a portion 90 (e.g., of material 32) that is directly under one of digitlines 39. Any other attribute(s) or aspect(s) as shown and/or described herein with respect to other embodiments may be used.

Embodiments of the invention encompass methods used in forming memory circuitry. Embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments. Example such method embodiments are described with reference to 9-17, with like numerals used for predecessor constructions to that shown by FIGS. 1-7. In one embodiment, a method used in forming memory circuitry comprises forming transistors (e.g., 25) individually comprising one source/drain region (e.g., 24) and another source/drain region (e.g., 26). A channel region (e.g., 27) is between the one and the another source/drain regions. A conductive gate (e.g., material 22) is operatively proximate the channel.

Figure 9:
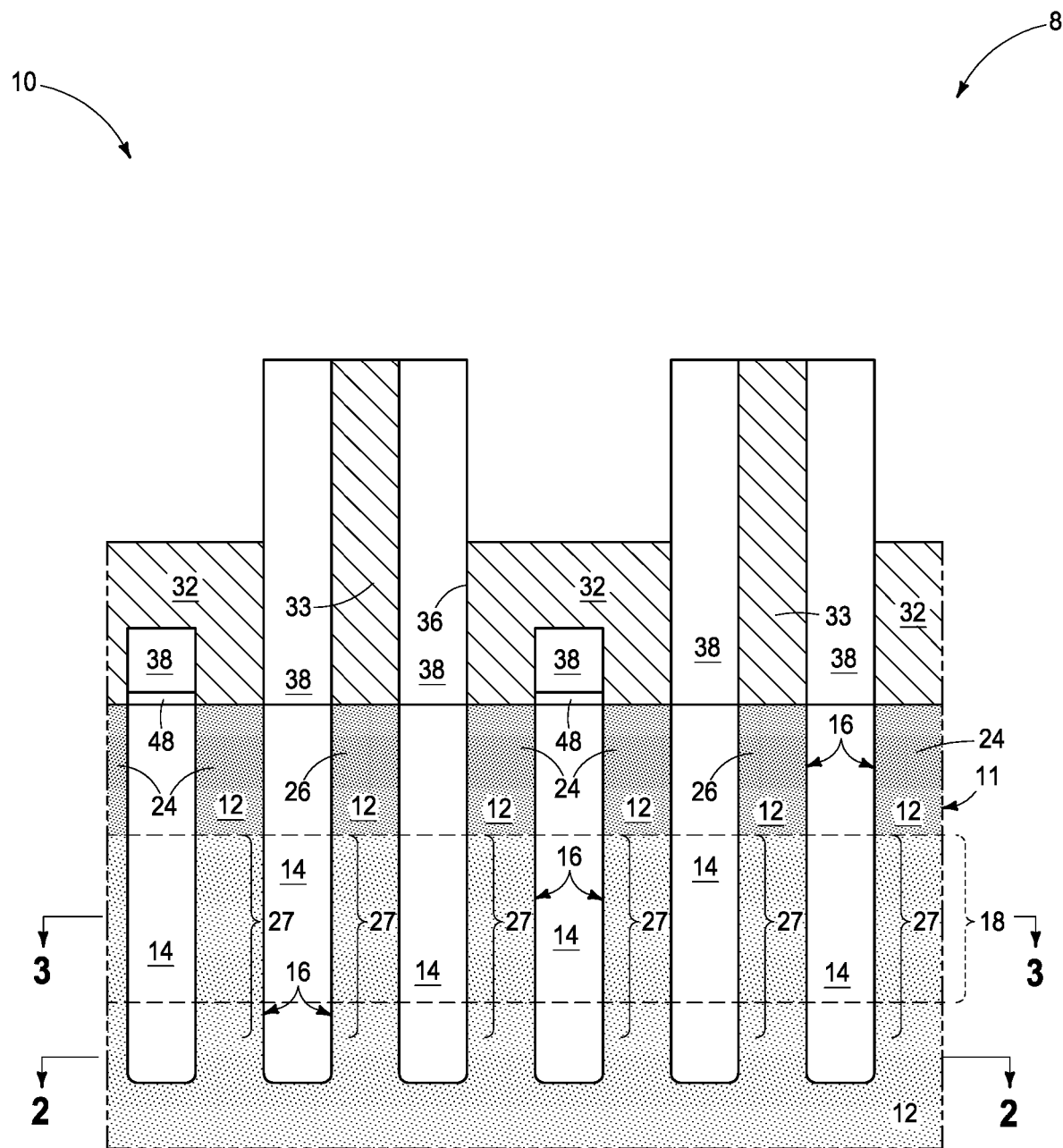
FIGS. 9-17 are diagrammatic sequential sectional views of predecessor constructions to that of FIGS. 1-7 in a process of forming the construction of FIGS. 1-7 in accordance with some embodiments of the invention.

Referring to FIG. 9, such corresponds in cross-section to that of FIG. 1 and wherein conductive vias 33 have been formed and that are individually directly electrically coupled to the another source/drain region 26.

Figure 10:
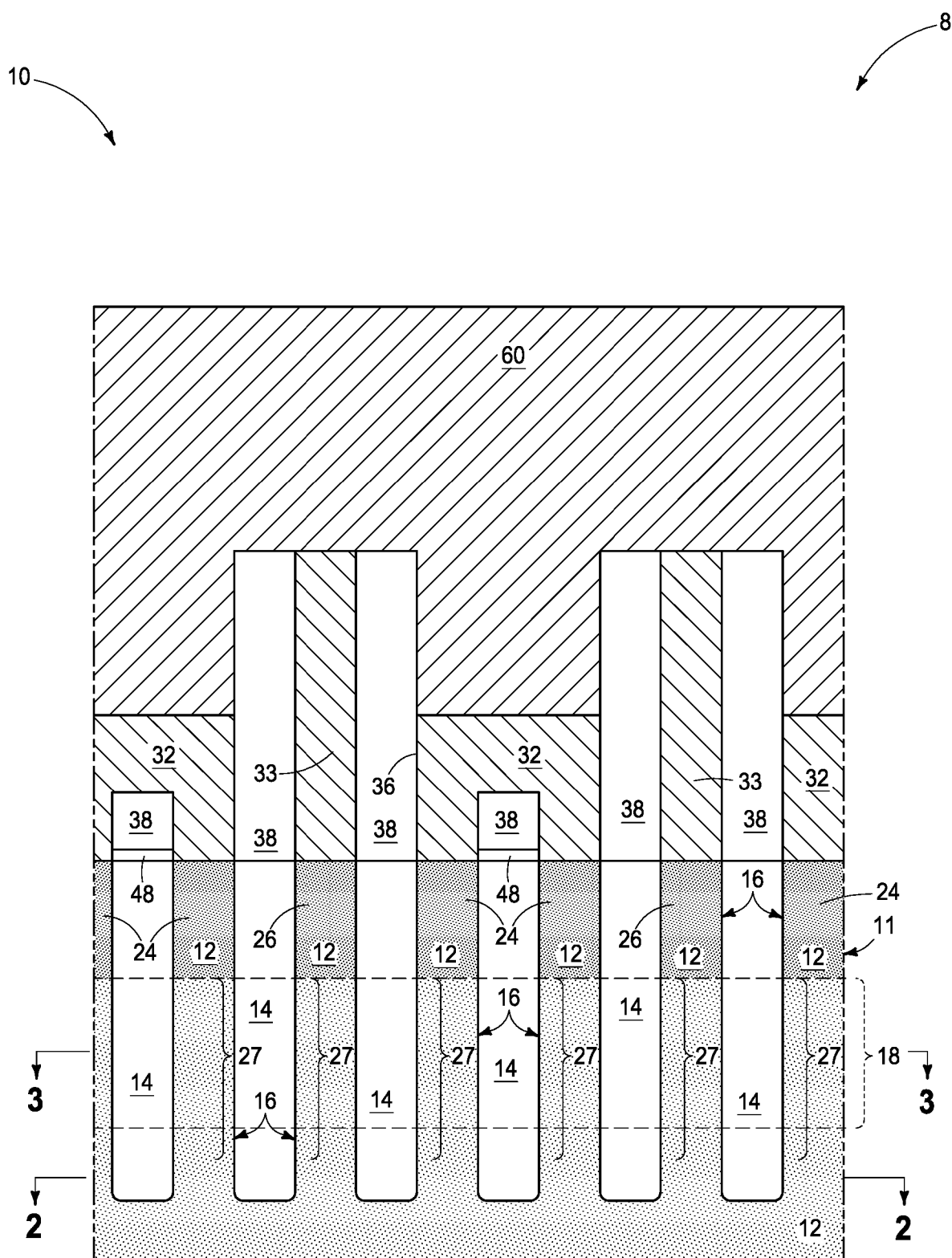

Referring to FIG. 10, conductor material 60 has been formed and that is directly coupled to the one source/drain region 24 (e.g., through material 32).

Figure 11:
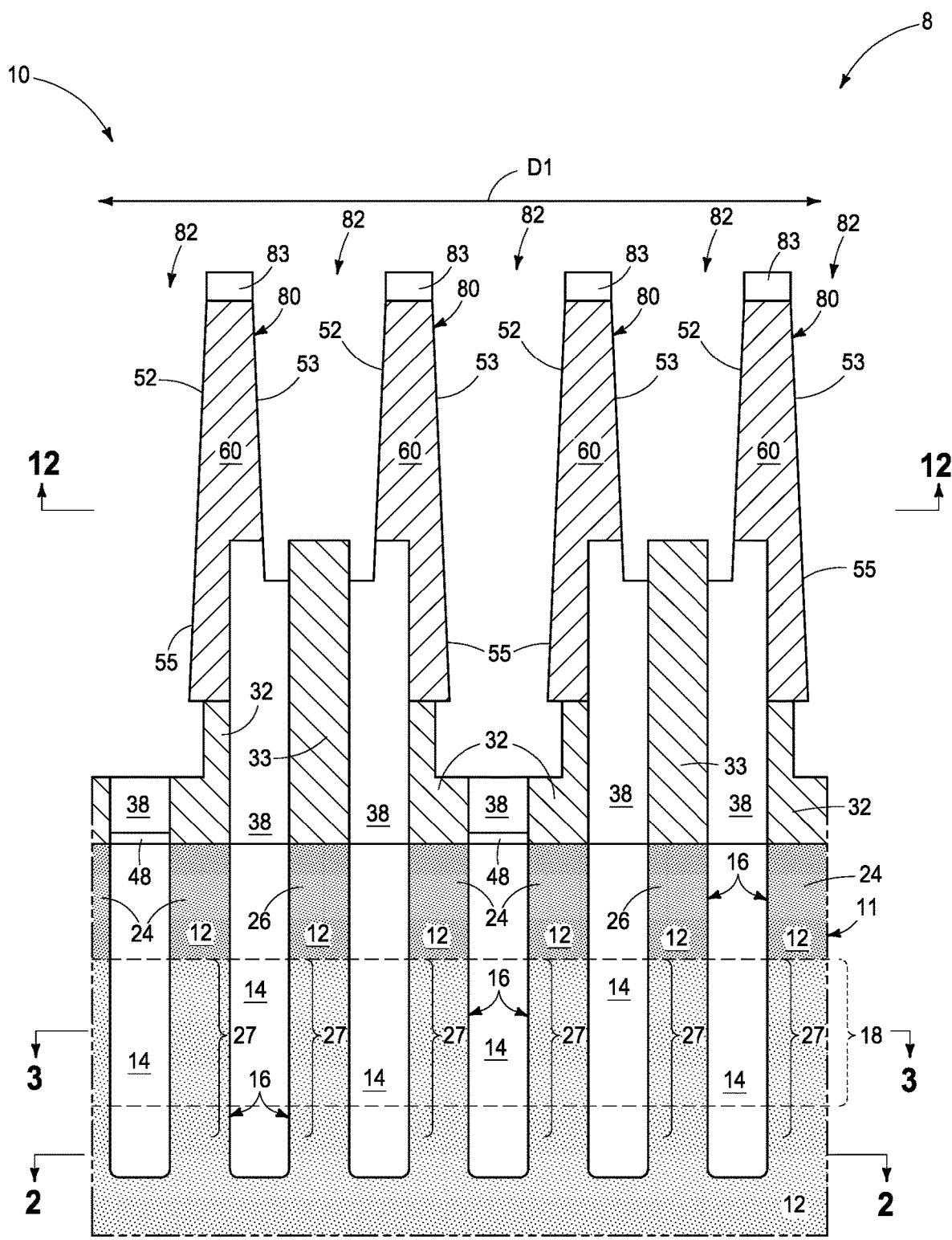
Figure 12:
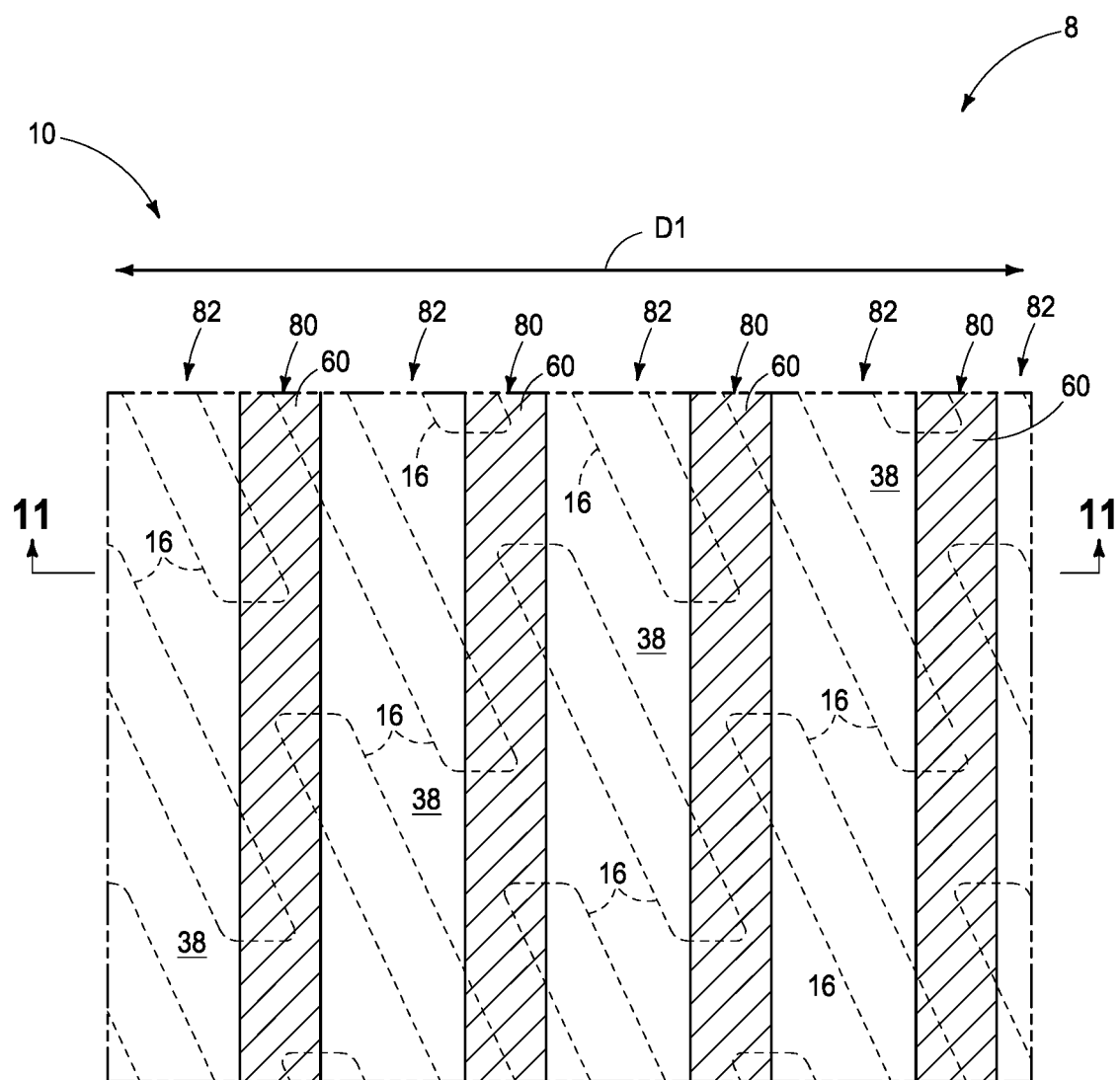

Referring to FIGS. 11 and 12, optional sacrificial material 83 has been formed over conductor material 60 and which has then been patterned in one direction (e.g., direction D1) to form horizontal lines 80 of conductor material 60 and that have a horizontal trench 82 between immediately-adjacent horizontal conductor-material lines 80.

Figure 13:
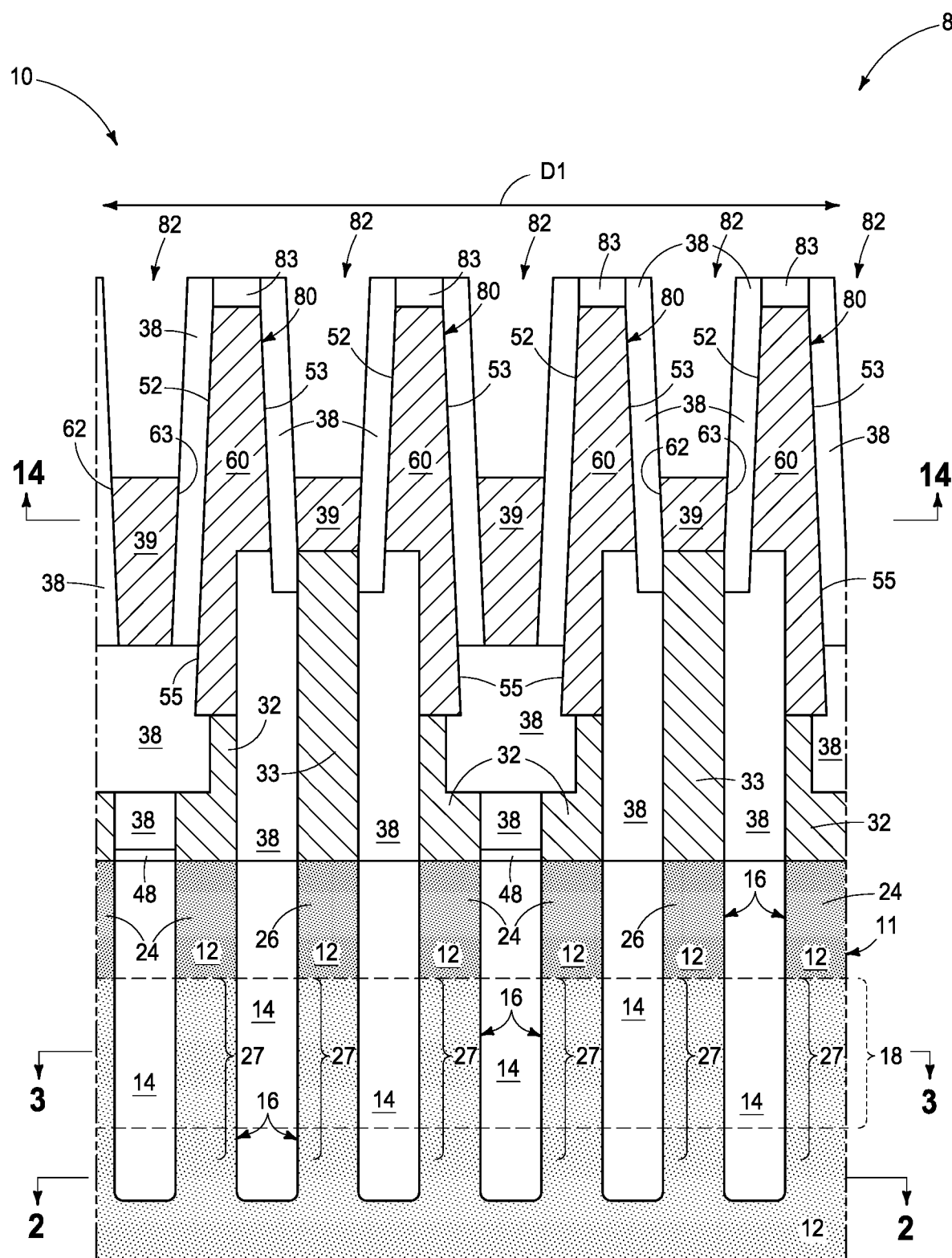
Figure 14:
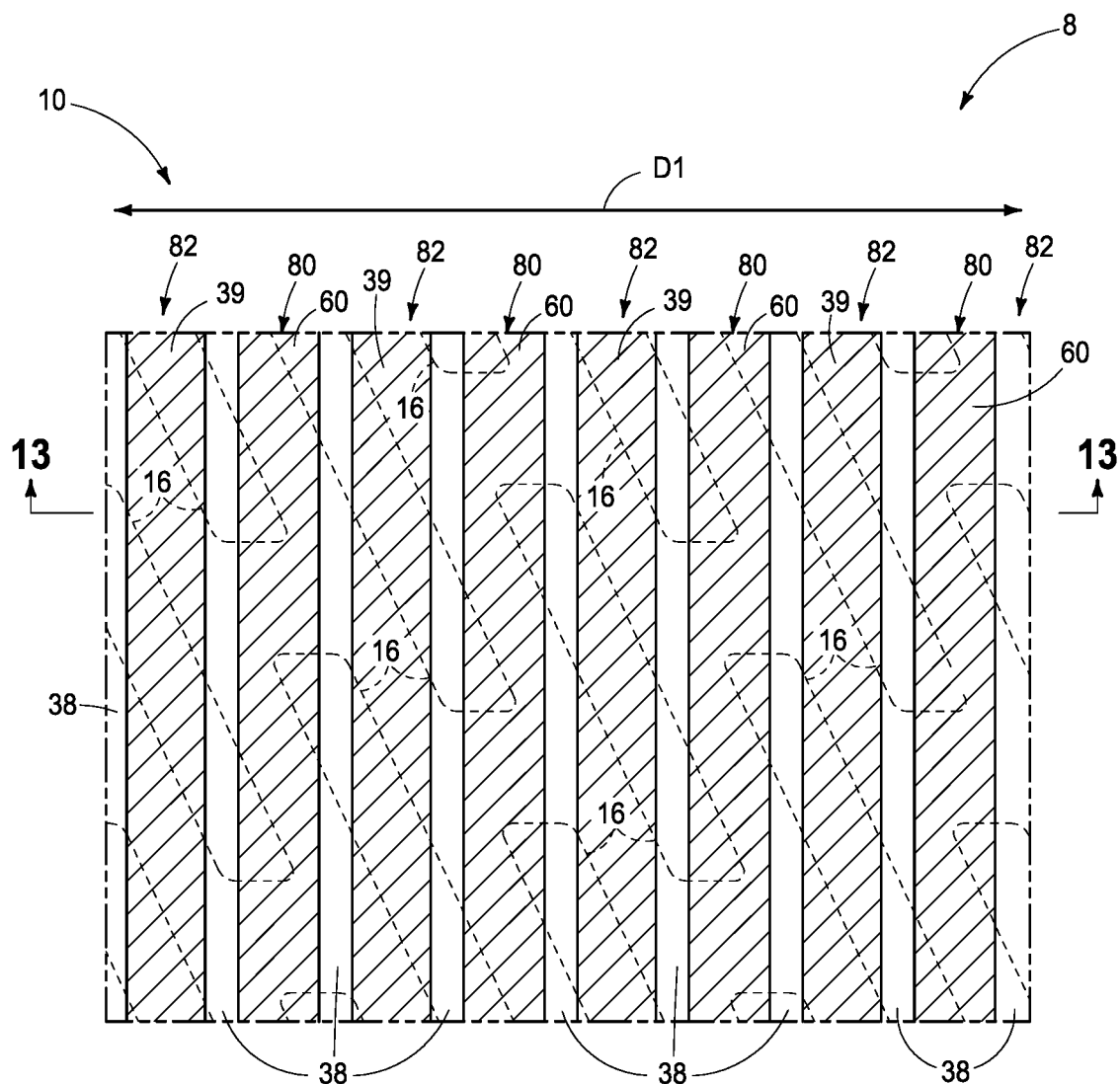
Figure 15:
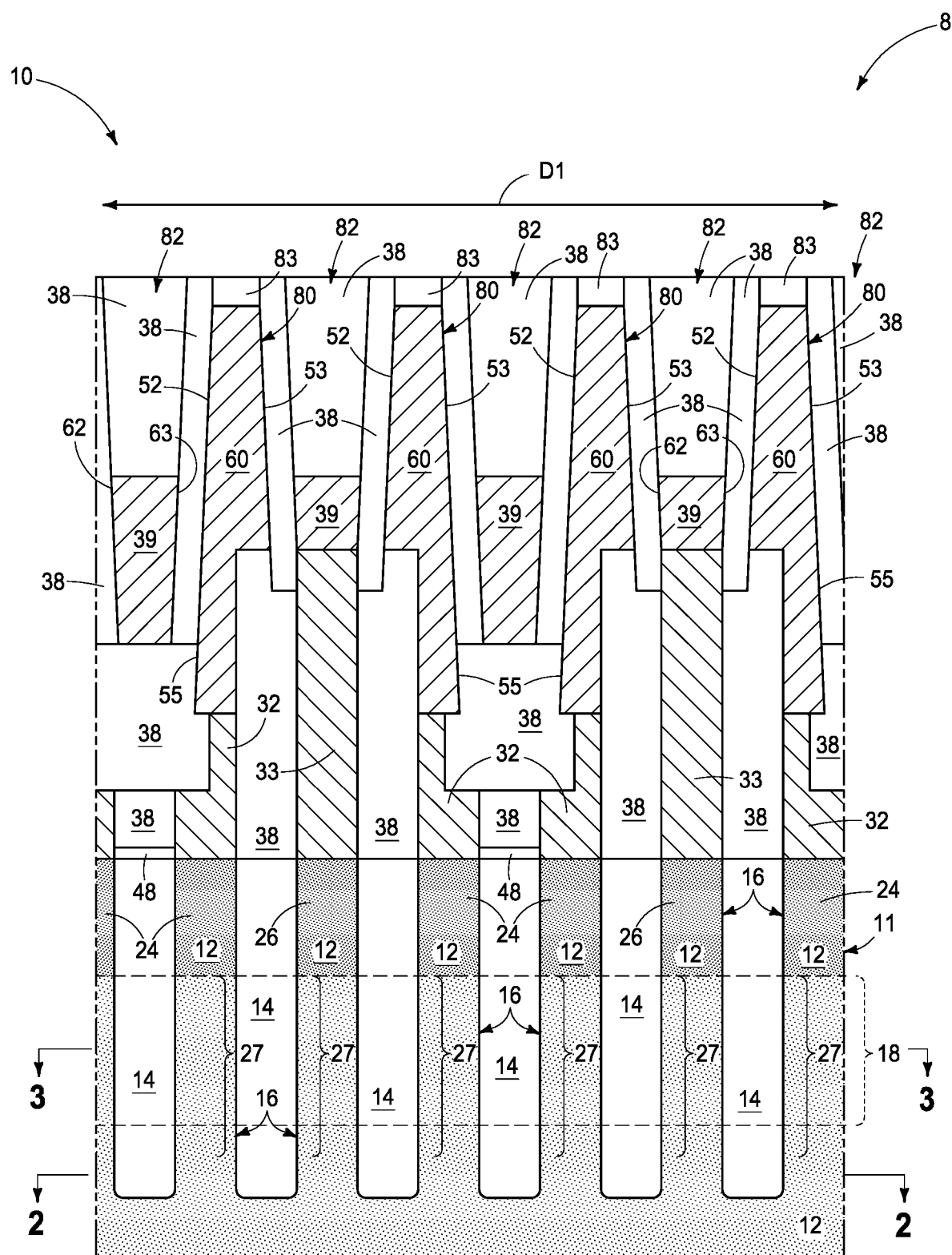

In a self-aligned manner, digitlines are formed that are individually in individual of the trenches between immediately-adjacent of the horizontal lines of the conductor material lines. One example such manner of doing so is shown in FIGS. 13 and 14. Such shows filling and then etch-back of insulative material 38 in trenches 82 to have tops corresponding to bottoms of digitlines 39 as shown in FIG. 1. Thereafter, insulative material 38 as a lining has been deposited into trenches 24 and then anisotropically etched in a spacer-like manner to substantially remove such from being over horizontal surfaces. Then, conductive material of digitlines 39 has been deposited into remaining volume of trenches 82, followed by etching back such conductive material to form digitlines 39 as shown. FIG. 15 shows subsequent deposition and planarizing back of insulative material 38 atop digitlines 39.

Figure 16:
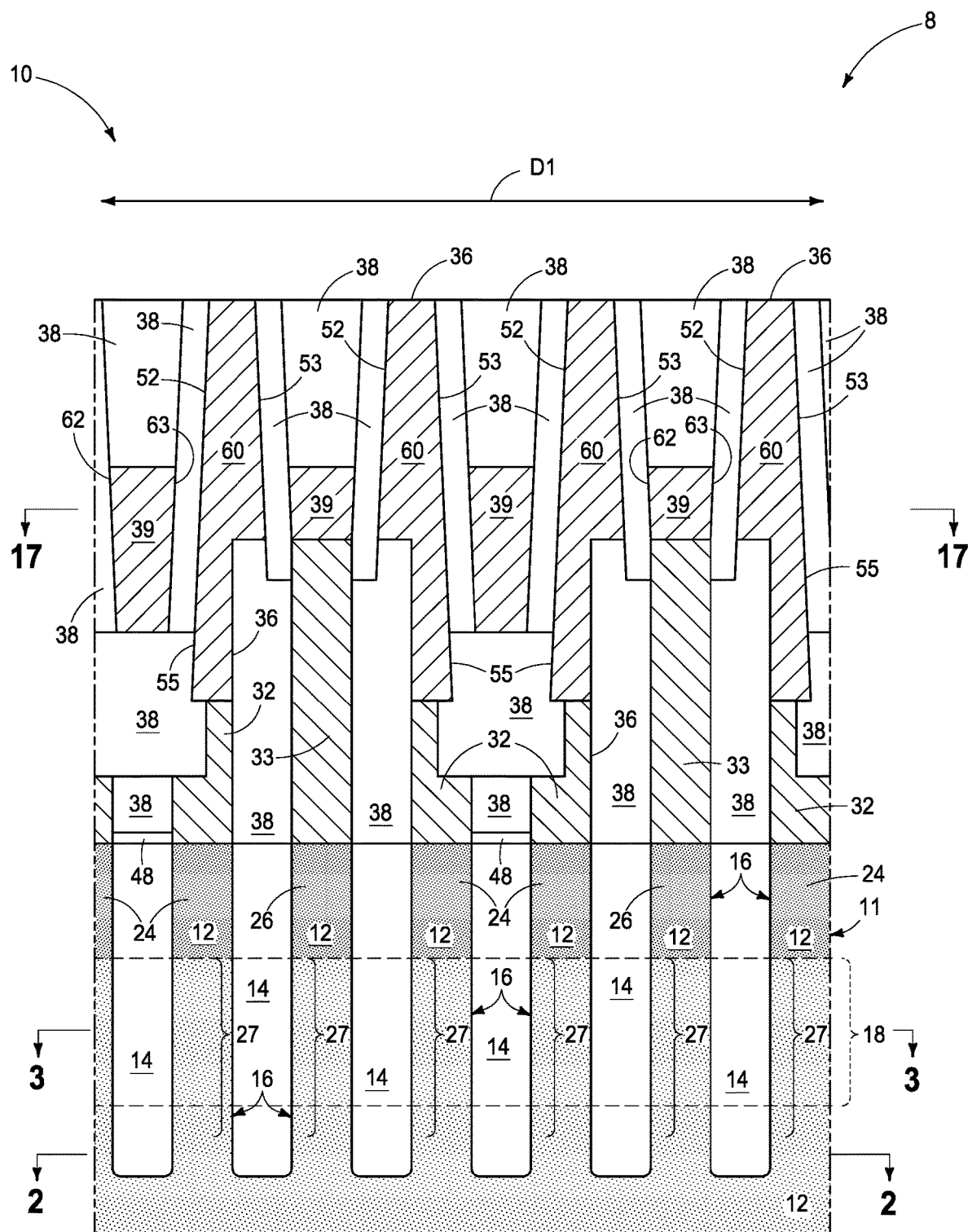
Figure 17:
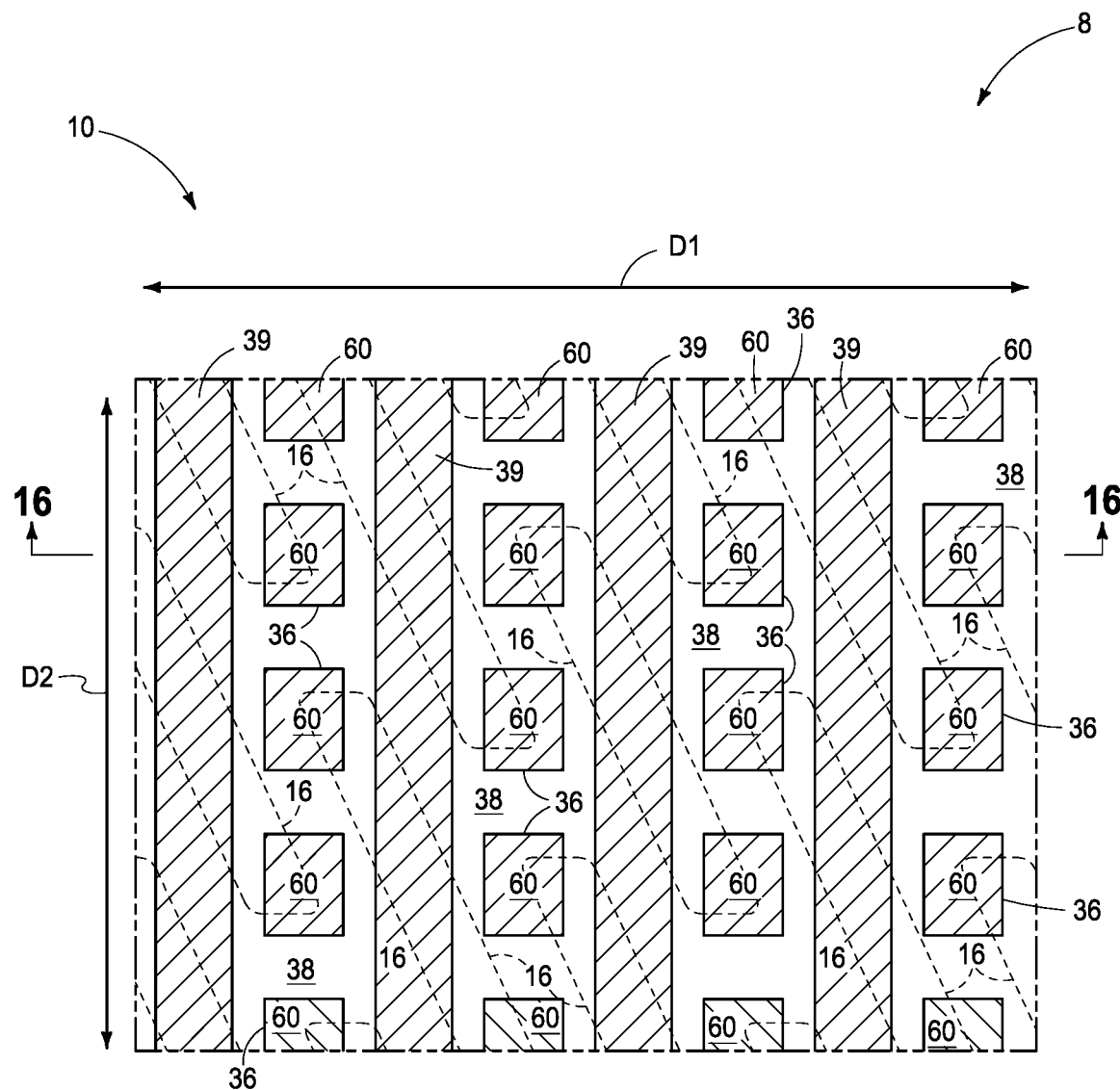

After forming digitlines 39, and referring to FIGS. 16 and 17, conductor material 60 is patterned in another direction (e.g., D2) that is horizontally angled from one direction D1 (e.g., at 90°) to form conductor vias 36 that are individually directly electrically coupled to one source/drain region 24. A plurality of storage elements (e.g., 85 in FIG. 1) are ultimately formed and that are individually directly electrically coupled to individual conductor vias 36.

In one embodiment, the formed memory circuitry comprises DRAM. In one embodiment, conductor vias 36 in a vertical cross-section (e.g., that of FIG. 1) individually include a vertical portion 51 having two sidewalls 52, 53 that taper laterally-outward from top-to-bottom. In one embodiment, digitlines 39 in a vertical cross-section (e.g., that of FIG. 1) individually have two sidewalls 62, 63 that taper laterally-inward from top-to-bottom.

In one embodiment, conductor vias 36 individually comprise lower conductively-doped semiconductive material 32 (e.g., conductively-doped polysilicon) directly electrically coupled to, in embodiment directly against, one source/drain region 24. Upper metal material 60 is directly above and directly electrically coupled to, in one embodiment directly against, lower conductively-doped semiconductive material 32. In one embodiment, upper metal material 60 covers all of a top surface 61 of lower conductively-doped semiconductive material 32.

In one embodiment, the conductor vias (e.g., 36a) individually comprise a portion (e.g., 90) that is directly under one of digitlines 39 (FIG. 8).

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Herein, "self-aligned" or "self-aligning" means a technique whereby at least a lateral surface of a later-formed structure is defined by deposition of material against a sidewall of a previously-formed structure thereby not requiring subsequent photolithographic or other processing with respect to the lateral surface of the later-formed structure.

Unless otherwise indicated, use of "or" herein encompasses either and both.

CONCLUSION

In some embodiments, memory circuitry comprises a substrate comprising transistors individually comprising a pair of source/drain regions. A channel region is between the pair of source/drain regions. A conductive gate is operatively proximate the channel region. Conductor vias are individually directly electrically coupled to one of the source/drain regions of the pair of source/drain regions. The conductor vias in a vertical cross-section individually include a vertical portion that has two sidewalls that taper laterally-outward from top-to-bottom. Conductive vias are individually directly electrically coupled to the other of the source/drain regions of the pair of source/drain regions. Digitlines are individually directly electrically coupled to a plurality of the conductive vias along a line of multiple of the transistors. A storage element is directly electrically coupled to individual of the conductor vias.

In some embodiments, memory circuitry comprises a substrate comprising transistors individually comprising a pair of source/drain regions. A channel region is between the pair of source/drain regions. A conductive gate is operatively proximate the channel region. Conductor vias are individually directly electrically coupled to one of the source/drain regions of the pair of source/drain regions. Conductive vias are individually directly electrically coupled to the other of the source/drain regions of the pair of source/drain regions. Digitlines are individually directly electrically coupled to a plurality of the conductive vias along a line of multiple of the transistors. The digitlines in a vertical cross-section individually have two sidewalls that taper laterally-inward from top-to-bottom. A storage element is directly electrically coupled to individual of the conductor vias.

In some embodiments, memory circuitry comprises a substrate comprising transistors individually comprising a pair of source/drain regions. A channel region is between the pair of source/drain regions. A conductive gate is operatively proximate the channel region. Conductor vias are individually directly electrically coupled to one of the source/drain regions of the pair of source/drain regions. Conductive vias are individually directly electrically coupled to the other of the source/drain regions of the pair of source/drain regions. Digitlines are individually directly electrically coupled to a plurality of the conductive vias along a line of multiple of the transistors. The conductor vias individually comprise lower conductively-doped semiconductive material directly electrically coupled to the one source/drain region. Upper metal material is directly above and directly electrically coupled to the lower conductively-doped semiconductive material. The upper metal material covers all of a top surface of the lower conductively-doped semiconductive material. A storage element is directly electrically coupled to the upper metal material of individual of the conductor vias.

In some embodiments, memory circuitry comprises a substrate comprising transistors individually comprising a pair of source/drain regions. A channel region is between the pair of source/drain regions. A conductive gate is operatively proximate the channel region. Conductor vias are individually directly electrically coupled to one of the source/drain regions of the pair of source/drain regions. The conductor vias in a vertical cross-section individually include a vertical portion that has two sidewalls that taper laterally-outward from top-to-bottom. Conductive vias are individually directly electrically coupled to the other of the source/drain regions of the pair of source/drain regions. Digitlines are individually directly electrically coupled to a plurality of the conductive vias along a line of multiple of the transistors. The digitlines in a vertical cross-section individually have two sidewalls that taper laterally-inward from top-to-bottom. The conductor vias individually comprise lower conductively-doped semiconductive material directly electrically coupled to the one source/drain region. Upper metal material is directly above and directly electrically coupled to the lower conductively-doped semiconductive material. The upper metal material covers all of a top surface of the lower conductively-doped semiconductive material. A storage element is directly electrically coupled to individual of the conductor vias.

In some embodiments, memory circuitry comprises a substrate comprising transistors individually comprising a pair of source/drain regions. A channel region is between the pair of source/drain regions. A conductive gate is operatively proximate the channel region. Conductor vias are individually directly electrically coupled to one of the source/drain regions of the pair of source/drain regions. Conductive vias are individually directly electrically coupled to the other of the source/drain regions of the pair of source/drain regions. Digitlines are individually directly electrically coupled to a plurality of the conductive vias along a line of multiple of the transistors. A storage element is directly electrically coupled to individual of the conductor vias. The conductor vias individually comprise a portion that is directly under one of the digitlines.

In some embodiments, a method used in forming memory circuitry comprises forming transistors individually comprising one source/drain region and another source/drain region. A channel region is between the one and the another source/drain regions. A conductive gate is operatively proximate the channel region. Conductive vias are formed that are individually directly electrically coupled to the another source/drain region. Conductor material is formed that is directly coupled to the one source/drain region. The conductor material is patterned in one direction to form horizontal lines of the conductor material that have a horizontal trench between immediately-adjacent of the horizontal conductor-material lines. In a self-aligned manner, digitlines are formed that are individually in individual of the trenches between the immediately-adjacent conductor-material lines. After forming the digitlines, the conductor material is patterned in another direction that is horizontally angled from the one direction to form conductor vias that are individually directly electrically coupled to the one source/drain region. A plurality of storage elements is formed that are individually directly electrically coupled to individual of the conductor vias.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry, comprising:
 a substrate comprising transistors individually comprising:
   a pair of source/drain regions;
   a channel region between the pair of source/drain regions; and
   a conductive gate operatively proximate the channel region;
 conductor vias that are individually directly electrically coupled to one of the source/drain regions of the pair of source/drain regions, the conductor vias in a vertical cross-section individually including a vertical portion having two sidewalls that taper laterally-outward from top-to-bottom;
 conductive vias that are individually directly electrically coupled to the other of the source/drain regions of the pair of source/drain regions;

digitlines that are individually directly electrically coupled to a plurality of the conductive vias along a line of multiple of the transistors; and a storage element directly electrically coupled to individual of the conductor vias.

2. The memory circuitry of claim 1 wherein the vertical portion is less-than-all of the respective conductor via in the vertical cross-section.

3. The memory circuitry of claim 2 wherein the vertical portion is one vertical portion, the conductor vias in the vertical cross-section individually including another vertical portion that is below the one vertical portion, the another vertical portion having one sidewall that tapers laterally-outward from top-to-bottom and another sidewall that does not taper laterally-outward from top-to-bottom.

4. The memory circuitry of claim 3 wherein the another sidewall is vertical.

5. The memory circuitry of claim 1 wherein the digitlines in the vertical cross-section individually have two sidewalls that taper laterally-inward from top-to-bottom.

6. The memory circuitry of claim 1 wherein the conductor vias individually comprise:
lower conductively-doped semiconductive material directly electrically coupled to the one source/drain region; and
upper metal material directly above and directly electrically coupled to the lower conductively-doped semiconductive material, the upper metal material covering all of a top surface of the lower conductively-doped semiconductive material.

7. The method of claim 6 wherein the vertical portion is the upper metal material.

8. The memory circuitry of claim 1 wherein the conductor vias individually comprise a portion that is directly under one of the digitlines.

9. The memory circuitry of claim 8 wherein the portion that is directly under one of the digitlines is in the vertical cross-section.

10. The memory circuitry of claim 1 wherein the storage elements are capacitors.

11. The memory circuitry of claim 1 comprising DRAM.

12. Memory circuitry, comprising:
a substrate comprising transistors individually comprising:
a pair of source/drain regions;
a channel region between the pair of source/drain regions; and
a conductive gate operatively proximate the channel region;
conductor vias that are individually directly electrically coupled to one of the source/drain regions of the pair of source/drain regions;
conductive vias that are individually directly electrically coupled to the other of the source/drain regions of the pair of source/drain regions;
digitlines that are individually directly electrically coupled to a plurality of the conductive vias along a line of multiple of the transistors, the digitlines in a vertical cross-section individually having two sidewalls that taper laterally-inward from top-to-bottom; and
a storage element directly electrically coupled to individual of the conductor vias.

13. The memory circuitry of claim 12 wherein the conductor vias individually comprise:
lower conductively-doped semiconductive material directly electrically coupled to the one source/drain region; and
upper metal material directly above and directly electrically coupled to the lower conductively-doped semiconductive material, the upper metal material covering all of a top surface of the lower conductively-doped semiconductive material.

14. The memory circuitry of claim 12 wherein the conductor vias individually comprise a portion that is directly under one of the digitlines.

15. Memory circuitry, comprising:
a substrate comprising transistors individually comprising:
a pair of source/drain regions;
a channel region between the pair of source/drain regions; and
a conductive gate operatively proximate the channel region;
conductor vias that are individually directly electrically coupled to one of the source/drain regions of the pair of source/drain regions;
conductive vias that are individually directly electrically coupled to the other of the source/drain regions of the pair of source/drain regions;
digitlines that are individually directly electrically coupled to a plurality of the conductive vias along a line of multiple of the transistors;
the conductor vias individually comprising:
lower conductively-doped semiconductive material directly electrically coupled to the one source/drain region; and
upper metal material directly above and directly electrically coupled to the lower conductively-doped semiconductive material, the upper metal material covering all of a top surface of the lower conductively-doped semiconductive material; and
a storage element directly electrically coupled to the upper metal material of individual of the conductor vias.

16. The memory circuitry of claim 15 wherein the upper metal material extends laterally outward beyond at least one side of the top surface of the lower conductively-doped semiconductive material in a vertical cross-section.

17. The memory circuitry of claim 16 wherein the upper metal material extends laterally outward beyond only one side of the top surface of the lower conductively-doped semiconductive material in the vertical cross-section.

18. The memory circuitry of claim 15 wherein the conductor vias individually comprise a portion that is directly under one of the digitlines.

19. Memory circuitry, comprising:
a substrate comprising transistors individually comprising:
a pair of source/drain regions;
a channel region between the pair of source/drain regions; and
a conductive gate operatively proximate the channel region;
conductor vias that are individually directly electrically coupled to one of the source/drain regions of the pair of source/drain regions;
conductive vias that are individually directly electrically coupled to the other of the source/drain regions of the pair of source/drain regions;
digitlines that are individually directly electrically coupled to a plurality of the conductive vias along a line of multiple of the transistors;
a storage element directly electrically coupled to individual of the conductor vias; and the conductor vias individually comprising a portion that is directly under one of the digitlines.

20. The memory circuitry of claim 19 wherein the portion comprises metal material.

\* \* \* \* \*